(12) United States Patent
Kobayashi

(10) Patent No.: US 12,052,819 B2
(45) Date of Patent: Jul. 30, 2024

(54) PRINTED WIRING BOARD AND METHOD FOR MANUFACTURING PRINTED WIRING BOARD

(71) Applicant: IBIDEN CO., LTD., Gifu (JP)

(72) Inventor: Tomohiro Kobayashi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 60 days.

(21) Appl. No.: 17/707,196

(22) Filed: Mar. 29, 2022

(65) Prior Publication Data

US 2022/0330427 A1 Oct. 13, 2022

(30) Foreign Application Priority Data

Apr. 8, 2021 (JP) .................................. 2021-065914

(51) Int. Cl.
H05K 1/11 (2006.01)
H05K 3/40 (2006.01)
H05K 3/46 (2006.01)

(52) U.S. Cl.
CPC ................ H05K 1/11 (2013.01); H05K 1/111 (2013.01); H05K 3/4007 (2013.01); H05K 3/4644 (2013.01); H05K 2201/093 (2013.01)

(58) Field of Classification Search
CPC ...... H05K 1/11; H05K 3/4007; H05K 3/4644; H05K 2201/093; H05K 3/181; H05K 1/111; Y02P 70/50

See application file for complete search history.

(56) References Cited

U.S. PATENT DOCUMENTS

| | | | |
|---|---|---|---|
| 8,149,585 B2* | 4/2012 | Kawano | H01L 23/147 361/782 |
| 9,620,446 B2* | 4/2017 | Shimizu | H05K 1/115 |
| 2008/0308931 A1* | 12/2008 | Rinne | H05K 3/243 257/737 |
| 2012/0186863 A1* | 7/2012 | Inoue | H01L 23/12 174/257 |
| 2019/0371715 A1* | 12/2019 | Arai | H01L 21/486 |
| 2021/0037660 A1* | 2/2021 | Kawai | H05K 1/111 |
| 2022/0330428 A1* | 10/2022 | Kawai | H05K 3/4007 |

FOREIGN PATENT DOCUMENTS

| | | | |
|---|---|---|---|
| JP | 2001168224 A | * | 6/2001 |
| JP | 2010-129996 A | | 6/2010 |

OTHER PUBLICATIONS

Electronic circuit device (Year: 2001), English Abstract.*

* cited by examiner

*Primary Examiner* — Ishwarbhai B Patel

(74) *Attorney, Agent, or Firm* — Oblon, McClelland, Maier & Neustadt, L.L.P.

(57) ABSTRACT

A printed wiring board includes a base insulating layer, a conductor layer formed on the base layer and including pads, a solder resist layer formed on the base layer such that the solder resist layer is covering the conductor layer and has openings exposing the pads, and plating bumps formed on the pads such that each plating bump includes a base plating layer formed in a respective one of the openings, an intermediate layer formed on the base plating layer, and a top plating layer formed on the intermediate layer. The plating bumps are formed such that the base plating layer has a side surface including a portion protruding from the solder resist layer, that the intermediate layer has a thickness in a range of 2.7 to 7.0 μm, and that the top plating layer has a hemispherical shape and is covering only an upper surface of the intermediate layer.

20 Claims, 3 Drawing Sheets

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2021-065914, filed Apr. 8, 2021, the entire contents of which are incorporated herein by reference.

BACKGROUND OF THE INVENTION

Field of the Invention

The present invention relates to a printed wiring board having multiple plating bumps, and a method for manufacturing the printed wiring board.

Description of Background Art

Japanese Patent Application Laid-Open Publication No. 2010-129996 discloses an example of a printed wiring board having multiple plating bumps. The entire contents of this publication are incorporated herein by reference.

SUMMARY OF THE INVENTION

According to one aspect of the present invention, a printed wiring board includes a base insulating layer, a conductor layer formed on the base insulating layer and including conductor pads, a solder resist layer formed on the base insulating layer such that the solder resist layer is covering the conductor layer and has openings exposing the conductor pads, respectively, and plating bumps formed on the conductor pads respectively such that each of the plating bumps includes a base plating layer formed in a respective one of the openings in the solder resist layer, an intermediate layer formed on the base plating layer, and a top plating layer formed on the intermediate layer. The plating bumps are formed such that the base plating layer has a side surface including a portion protruding from the solder resist layer, that the intermediate layer has a thickness in a range of 2.7 to 7.0 μm, and that the top plating layer has a hemispherical shape and is covering only an upper surface of the intermediate layer.

According to another aspect of the present invention, a method for manufacturing a printed wiring board includes forming a conductor layer including conductor pads on a base insulating layer, forming a solder resist layer on the base insulating layer such that the solder resist layer coves the conductor layer, forming openings in the solder resist layer such that the openings expose the conductor pads, respectively, forming plating bumps on the conductor pads respectively such that each of the plating bumps includes a base plating layer, an intermediate layer, and a top plating layer, and reflowing the top plating layer such that the top plating layer has a hemispherical shape and covers only an upper surface of the intermediate layer. The forming of the plating bumps includes forming the base plating layer in a respective one of the opening such that the base plating layer has a side surface including a portion protruding from the solder resist layer, forming the intermediate layer on the base plating layer such that the intermediate layer is adjusted to have a thickness in a range of 2.7 to 7.0 μm, and forming the top plating layer on the intermediate layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
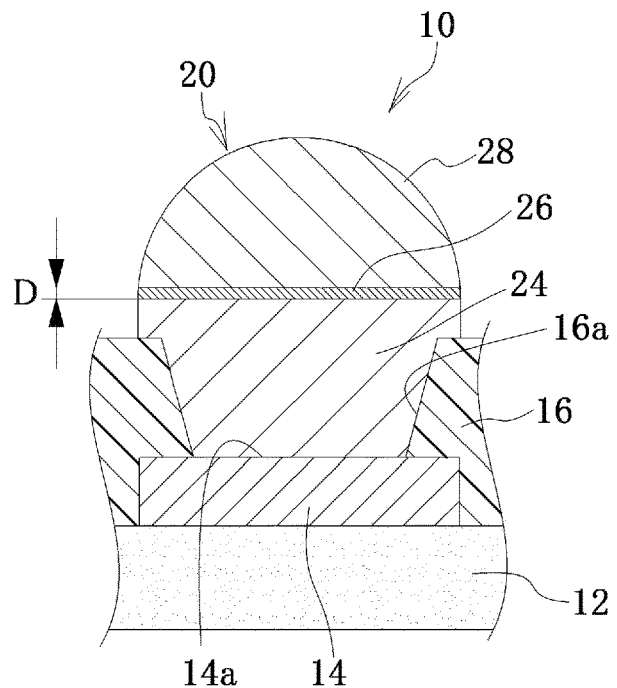
FIG. 1 is a cross-sectional view for describing a structure of a plating bump in a printed wiring board according to an embodiment of the present invention.

Embodiments will now be described with reference to the accompanying drawings, wherein like reference numerals designate corresponding or identical elements throughout the various drawings.

Printed Wiring Board

A printed wiring board according to an embodiment of the present invention is described below with reference to the drawings. In the examples illustrated in FIGS. 1 and 2, dimensions of members, especially dimensions in a height direction, are described with dimensions different from actual dimensions to facilitate better understanding.

FIG. 1 is a cross-sectional view for describing a structure of a plating bump in a printed wiring board according to an embodiment of the present invention. FIG. 1 illustrates an enlarged view of a portion of a printed wiring board 10 of the embodiment. The printed wiring board 10 may be a substrate with a core formed by alternately laminating conductor layers and resin insulating layers on one side or both sides of a core substrate (not illustrated in the drawings), the conductor layers having predetermined circuit patterns. When the conductor layers are formed on both sides of the core substrate, conductor layers opposing each other via the core substrate may be connected to each other via through-hole conductors (not illustrated in the drawings). Or, the printed wiring board 10 may be a coreless substrate obtained by alternately laminating conductor layers and resin insulating layers on a support plate (not illustrated in the drawings) instead of a core substrate and then removing the support plate.

In any case, as illustrated in FIG. 1, the printed wiring board 10 includes at least a base insulating layer 12, which is formed the outermost among the resin insulating layers, a conductor layer 14, which is formed on the base insulating layer 12 and has a predetermined circuit pattern, and a solder resist layer 16, which is formed on the base insulating layer 12 and the conductor layer 14. Other multiple conductor layers and multiple resin insulating layers are often alternately provided below the base insulating layer 12, but are omitted in the drawings. However, it is also possible that the printed wiring board 10 is formed of one base insulating layer 12 and one conductor layer 14.

The base insulating layer 12 can be formed of, for example, a resin composition or the like containing an inorganic filler, such as silica or alumina, and an epoxy resin. The conductor layer 14 is formed of a conductive metal, for example, a metal containing copper as a main component. The solder resist layer 16 has an opening (16a) exposing a portion of the conductor layer 14 as a conductor pad (14a). An aspect ratio of the opening (16a), that is, a ratio of a depth to a diameter at a bottom thereof can be 0.5 or less. An underlayer (not illustrated in the drawings) may be formed on the conductor pad (14a). As the underlayer, a nickel layer formed on a surface of the conductor pad (14a), a palladium layer formed on the nickel layer, and a gold layer formed on the palladium layer can be exemplified. In addition, a nickel layer and a gold layer formed on the nickel layer can be exemplified.

The printed wiring board 10 further includes a plating bump 20 formed on the conductor pad (14a). The plating bump 20 can be used for connection to a power supply or a ground line or for connecting to a signal line. The plating bump 20 includes a base plating layer 24 formed in the opening (16a), an intermediate layer 26 formed on the base plating layer 24, and a top plating layer 28 formed on the intermediate layer 26. Further, the top plating layer 28 covers only an upper surface of the intermediate layer 26. An upper surface of the base plating layer 24 and the upper surface of the intermediate layer 26 can be a flat surface, a concave curved surface with a curvature (C), or a convex curved surface with a curvature (C), depending on an intended use.

The base plating layer 24 is formed of a conductive metal, preferably a metal containing copper as a main component. The base plating layer 24 is formed to a height exceeding a surface of the solder resist layer 16 (a surface on the opposite side with respect to the base insulating layer 12). As a result, the plating bump 20 is stably held in the opening (16a). A thickness of the base plating layer 24 measured from the surface of the solder resist layer 16 is preferably in a range of 3 μm-20 μm. The intermediate layer 26 is formed of, for example, a metal containing nickel as a main component. The top plating layer 28 is formed of a metal, which has a lower melting point than the base plating layer 24 and which is melted by a reflow treatment and is shaped into a substantially hemispherical shape as illustrated in FIG. 1, for example, a metal containing tin as a main component. A thickness of the top plating layer 28 (a distance in a vertical direction measured from the lower end of the top plating layer 28 to the top of the top plating layer on an outer peripheral surface of the bump 20) is preferably in a range of 5 μm-45 μm. By setting the thickness of the top plating layer 28 in this range, good connection reliability can be achieved between the plating bump 20 and a connection pad (not illustrated in the drawings) of an electronic component such as a semiconductor chip or a memory mounted on the printed wiring board 10.

In the example illustrated in FIG. 1, a feature of the printed wiring board 10 according to an embodiment of the present invention is that a thickness (D) of the intermediate layer 26 is as large as 2.7-7.0 μm, and the top plating layer 28 covers only the upper surface of the intermediate layer 26. Here, that the thickness (D) of the intermediate layer 26 is specified as 2.7-7.0 μm is because, when the thickness (D) of the intermediate layer 26 is less than 2.7 μm, the reflowed top plating layer 28 cannot be completely prevented from sagging onto side surfaces of the intermediate layer 26 and the base plating layer 24, and on the other hand, even when the thickness (D) of the intermediate layer 26 exceeds 7.0 μm, a sagging prevention effect when the thickness of the intermediate layer 26 is 7.0 μm cannot be further improved. According to the printed wiring board 10 of the present embodiment, by setting the thickness (D) of the intermediate layer 26 as large as 2.7-7.0 μm, when the top plating layer 28 is reflowed to form a hemispherical bump 20, the reflowed top plating layer 28 can be prevented from sagging onto the side surfaces of the intermediate layer 26 and the base plating layer 24, and the bump 20 can be maintained at a predetermined height.

Figure 2:
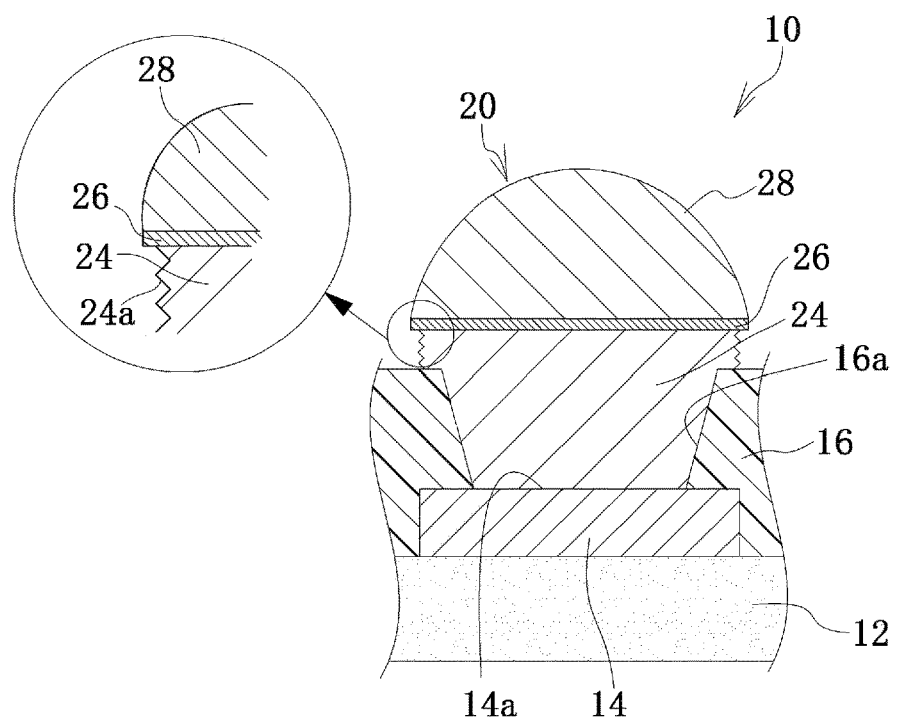
FIG. 2 is a cross-sectional view for describing a structure of a plating bump in a printed wiring board according to another embodiment of the present invention.

FIG. 2 is a cross-sectional view for describing a structure of a plating bump in a printed wiring board according to another embodiment of the present invention. Among the components illustrated in FIG. 2, components that are the same as in the components illustrated in FIG. 1 are indicated using the same reference numeral symbols and description thereof is omitted. The other embodiment illustrated in FIG. 2 differs from the embodiment illustrated in FIG. 1 in that, in addition to setting the thickness (D) of the intermediate layer 26 as large as 2.7-7.0 μm, there is a rough surface (24a) formed on the side surface of the base plating layer 24 protruding from the solder resist layer 16, and an edge of the intermediate layer 26 protrudes from the side surface of the base plating layer 24. Here, regarding a surface roughness of the rough surface (24a), an arithmetic mean roughness (Ra) thereof is preferably 0.35-1.00 μm.

According to the above-described printed wiring board 10 according to the other embodiment of the present invention, in addition to the effect of preventing the reflowed top plating layer 28 from sagging onto the side surface of the base plating layer 24 by setting the thickness of the intermediate layer 26 of the embodiment illustrated in FIG. 1 to 2.7-7.0 μm, the rough surface (24a) formed on the side surface of the base plating layer 24 and the intermediate layer 26 protruding from the side surface of the base plating layer 24 can prevent the reflowed top plating layer 28 from sagging onto the side surfaces of the intermediate layer 26 and the base plating layer 24, and the reflowed top plating layer 28 can be even more effectively prevented from sagging onto the side surface of the base plating layer 24.

Method for Manufacturing Printed Wiring Board

In the following, a method for manufacturing the printed wiring board 10 according to the present invention is described with reference to FIGS. 3A-3E.

Figure 3A:
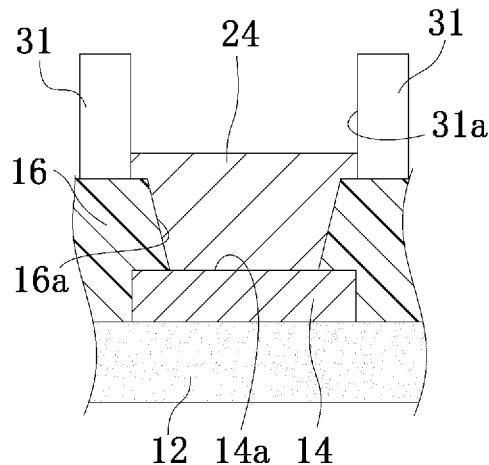
FIGS. 3A-3E are each a diagram for describing a process a method for manufacturing a printed wiring board according to an embodiment of the present invention.

FIG. 3A illustrates an intermediate in which, using known methods, in the plating bump 20, the conductor layer 14 having a predetermined circuit pattern, the solder resist layer 16, and a plating resist 31 are formed on the base insulating layer 12, and the base plating layer 24 is formed on the conductor pad (14a) of the conductor layer 14 in the opening (16a) of the solder resist layer 16 and an opening (31a) of the plating resist 31. Other multiple conductor layers and multiple resin insulating layers are often alternately formed below the base insulating layer 12, but are omitted in the drawings. The multiple conductor layers and the multiple resin insulating layers can be laminated on a core substrate or on a support plate that can be removed afterwards. However, it is also possible that the printed wiring board 10 is formed from one resin insulating layer as the base insulating layer 12 and one conductor layer as the conductor layer 14. In this case, the resin insulating layer corresponds to the base insulating layer 12.

For the base insulating layer 12, an insulating resin film for a build-up layer containing inorganic filler such as silica or alumina and an epoxy resin can be used. In the solder resist layer 16, for example, using carbon dioxide gas laser or UV-YAG laser or the like, the opening (16a) exposing a portion of the conductor layer 14 as the conductor pad (14a) is formed. An aspect ratio of the opening (16a) is preferably 0.5 or less. On the conductor pad (14a), an underlayer (not illustrated in the drawings) may be formed, for example, by laminating in this order a nickel layer, a palladium layer, and a gold layer by plating. The base plating layer 24 is formed by performing an electrolytic plating treatment of a conductive metal such as copper via the plating resist 31 of a predetermined pattern that is formed on the solder resist layer 16 and has the opening (31a) at a planned formation site of the plating bump 20.

Figure 3B:
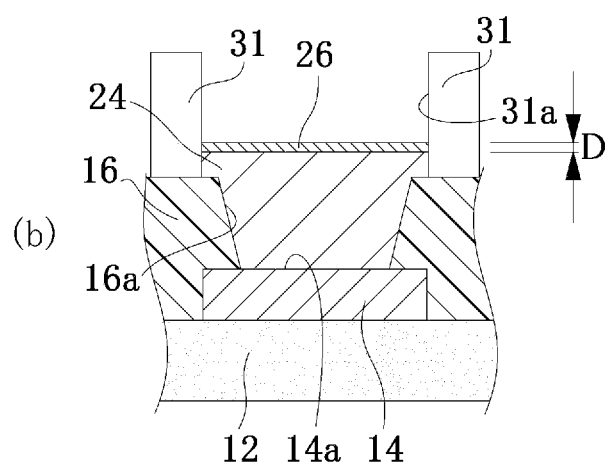
Figure 3C:
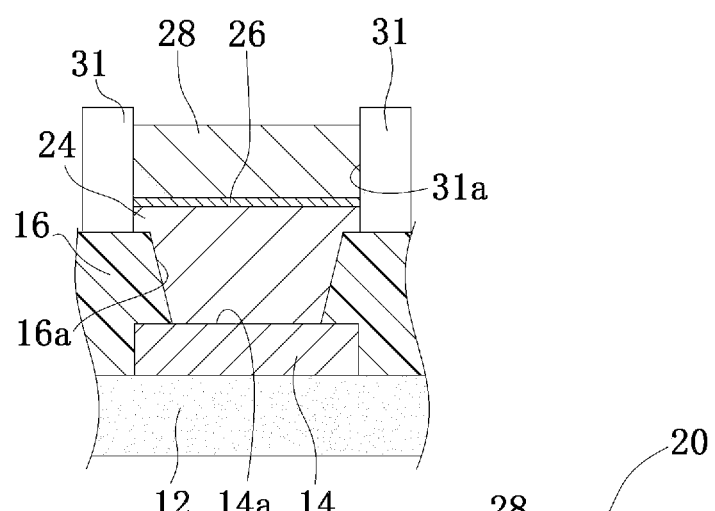
Figure 3D:
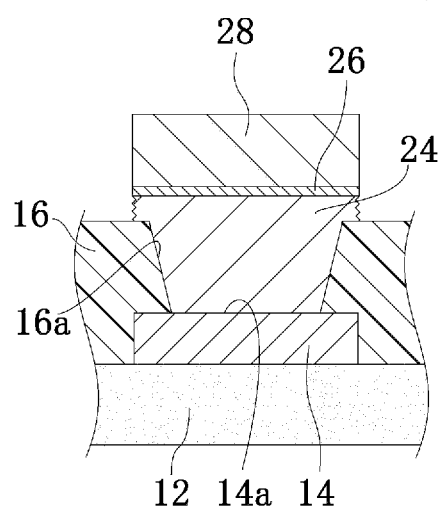

Next, as illustrated in FIG. 3B, in the plating bump 20, the intermediate layer 26 is formed in the opening (31a) of the plating resist 31, for example, by electroplating using nickel. Here, in an embodiment of the present invention, when the intermediate layer 26 is formed, the thickness (D) of the intermediate layer 26 is adjusted to 2.7-7.0 μm. Next, as illustrated in FIG. 3C, on the formed intermediate layer 26, the top plating layer 28 is formed, for example, by electroplating using tin. Next, as illustrated in FIG. 3D, the plating resist 31 is removed.

Figure 3E:
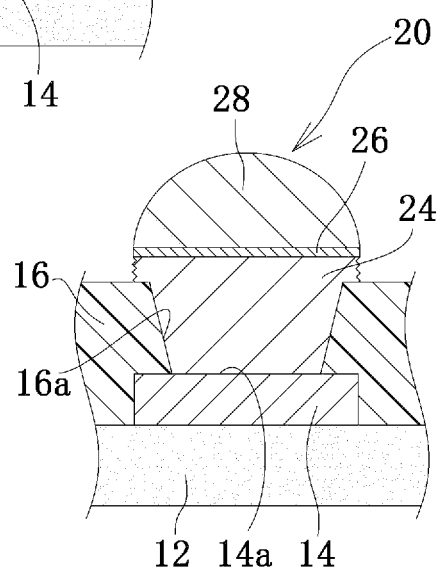

Finally, as illustrated in FIG. 3E, the plating bump 20 can be obtained by reflowing the top plating layer 28.

Figure 4:
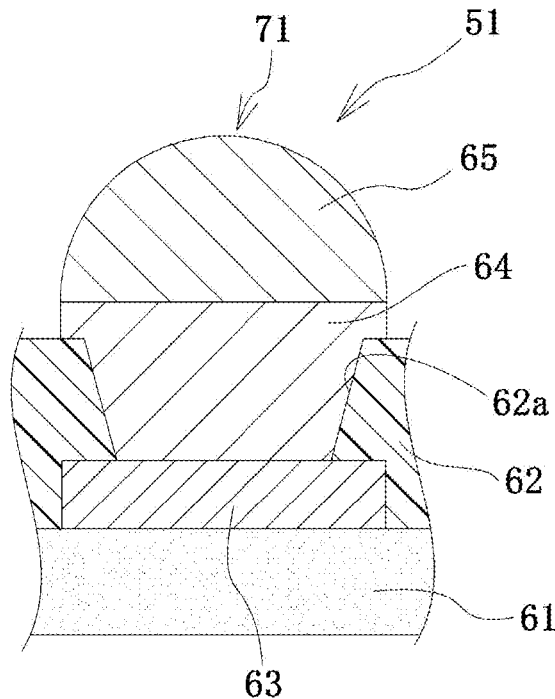
FIG. 4 illustrates an example of a conventional printed wiring board having multiple plating bumps.
Figure 5:
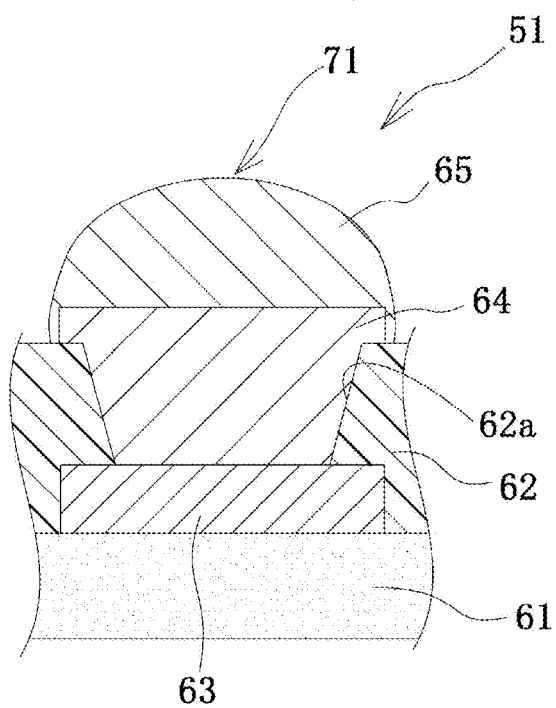
FIG. 5 is a diagram for describing a problem in an example of a conventional printed wiring board having multiple plating bumps.

FIG. 4 illustrates an example of a conventional plating bump of a printed wiring board having multiple plating bumps. In FIG. 4, in a printed wiring board 51, a solder resist layer 62 is formed on a base insulating layer 61, a base plating layer 64 is formed on a conductor pad 63 in an opening (62a) formed in the solder resist layer 62, a top plating layer 65 is formed on the base plating layer 64, and the top plating layer 65 is reflowed to form a plating bump 71.

A printed wiring board according to an embodiment of the present invention is a printed wiring board that has multiple plating bumps, and includes: a base insulating layer; a conductor layer that is formed on the base insulating layer; and a solder resist layer that is formed on the base insulating layer and on the conductor layer, and has multiple openings each exposing a portion of the conductor layer as a conductor pad. The plating bumps each include: a base plating layer that is formed in one of the openings of the solder resist layer, and has an upper surface and a side surface protruding from the solder resist layer; and a top plating layer that is formed in a hemispherical shape via an intermediate layer on the base plating layer. The intermediate layer has a thickness of 2.7-7.0 μm. The top plating layer covers only an upper surface of the intermediate layer.

A method for manufacturing a printed wiring board having multiple plating bumps according to another embodiment of the present invention includes: forming a base insulating layer; forming a conductor layer on the base insulating layer; forming a solder resist layer on the base insulating layer and on the conductor layer; forming, in the solder resist layer, multiple openings each exposing a portion of the conductor layer as a conductor pad; forming the plating bumps by: forming, in each of the openings, a base plating layer having an upper surface and a side surface protruding from the solder resist layer; forming a top plating layer via an intermediate layer on the base plating layer; and reflowing the top plating layer; adjusting the intermediate layer to have a thickness in a range of 2.7-7.0 μm; and covering only an upper surface of the intermediate layer with the top plating layer.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a base insulating layer;
a conductor layer formed on the base insulating layer and including a plurality of conductor pads;
a solder resist layer formed on the base insulating layer such that the solder resist layer is covering the conductor layer and has a plurality of openings exposing the plurality of conductor pads, respectively; and
a plurality of plating bumps formed on the plurality of conductor pads respectively such that each of the plating bumps includes a base plating layer formed in a respective one of the openings in the solder resist layer, an intermediate layer formed on the base plating layer, and a top plating layer formed on the intermediate layer,
wherein the plurality of plating bumps is formed such that the base plating layer has a side surface including a portion protruding from the solder resist layer, that the intermediate layer has a thickness in a range of 2.7 to 7.0 μm and an edge portion protruding from the portion of the side surface of the base plating layer and having a lower surface exposed from the base plating layer, and that the top plating layer has a hemispherical shape and is covering only an upper surface of the intermediate layer.

2. The printed wiring board according to claim 1, wherein the plurality of plating bumps is formed such that the base plating layer has an upper surface in which a concave curved surface portion or a convex curved surface portion is formed in a central portion of the upper surface.

3. The printed wiring board according to claim 2, wherein the plurality of plating bumps is formed such that the portion of the side surface of the base plating layer protruding from the solder resist layer has a rough surface.

4. The printed wiring board according to claim 3, wherein the plurality of plating bumps is formed such that the edge portion of the intermediate layer is configured to prevent the top plating layer from sagging onto a side surface of the intermediate layer and the side surface of the base plating layer when the top plating layer is reflowed.

5. The printed wiring board according to claim 2, wherein the plurality of plating bumps is formed such that the edge portion of the intermediate layer is configured to prevent the top plating layer from sagging onto a side surface of the intermediate layer and the side surface of the base plating layer when the top plating layer is reflowed.

6. The printed wiring board according to claim 1, wherein the plurality of plating bumps is formed such that the portion of the side surface of the base plating layer protruding from the solder resist layer has a rough surface.

7. The printed wiring board according to claim 6, wherein the plurality of plating bumps is formed such that the edge portion of the intermediate layer is configured to prevent the top plating layer from sagging onto a side surface of the intermediate layer and the side surface of the base plating layer when the top plating layer is reflowed.

8. The printed wiring board according to claim 1, wherein the plurality of plating bumps is formed such that the edge portion of the intermediate layer is configured to prevent the top plating layer from sagging onto a side surface of the intermediate layer and the side surface of the base plating layer when the top plating layer is reflowed.

9. The printed wiring board according to claim 1, wherein the plurality of plating bumps is formed such that the portion of the side surface of the base plating layer protruding from the solder resist layer has a rough surface having an arithmetic mean roughness Ra in a range of 0.35 to 1.00 μm.

10. The printed wiring board according to claim 1, wherein the plurality of plating bumps is formed such that the base plating layer has a thickness measured from a surface of the solder resist layer in a range of 3 μm to 20 μm.

11. The printed wiring board according to claim 1, wherein the plurality of plating bumps is formed such that the top plating layer has a thickness measured from a lower end of the top plating layer to a top of the top plating layer in a range of 5 μm to 45 μm.

12. The printed wiring board according to claim 1, wherein the plurality of plating bumps is formed such that the base plating layer includes a main component comprising copper, that the intermediate layer includes a main component comprising nickel, and that the top plating layer includes a main component comprising tin.

13. A method for manufacturing a printed wiring board, comprising:
   forming a conductor layer including a plurality of conductor pads on a base insulating layer;
   forming a solder resist layer on the base insulating layer such that the solder resist layer covers the conductor layer;
   forming a plurality of openings in the solder resist layer such that the plurality of openings exposes the plurality of conductor pads, respectively;
   forming a plurality of plating bumps on the plurality of conductor pads respectively such that each of the plating bumps includes a base plating layer, an intermediate layer, and a top plating layer; and
   reflowing the top plating layer such that the top plating layer has a hemispherical shape and covers only an upper surface of the intermediate layer,
   wherein the forming of the plating bumps includes forming the base plating layer in a respective one of the opening such that the base plating layer has a side surface including a portion protruding from the solder resist layer, forming the intermediate layer on the base plating layer such that the intermediate layer is adjusted to have a thickness in a range of 2.7 to 7.0 μm and an edge portion protruding from the portion of the side surface of the base plating layer and having a lower surface exposed from the base plating layer, and forming the top plating layer on the intermediate layer.

14. The method for manufacturing a printed wiring board according to claim 13, wherein the plurality of plating bumps is formed such that the base plating layer has an upper surface in which a concave curved surface portion or a convex curved surface portion is formed in a central portion of the upper surface.

15. The method for manufacturing a printed wiring board according to claim 13, wherein the plurality of plating bumps is formed such that the portion of the side surface of the base plating layer protruding from the solder resist layer has a rough surface.

16. The method for manufacturing a printed wiring board according to claim 13, wherein the plurality of plating bumps is formed such that the edge portion of the intermediate layer is configured to prevent the top plating layer from sagging onto a side surface of the intermediate layer and the side surface of the base plating layer when the top plating layer is reflowed.

17. The method for manufacturing a printed wiring board according to claim 13, wherein the plurality of plating bumps is formed such that the portion of the side surface of the base plating layer protruding from the solder resist layer has a rough surface having an arithmetic mean roughness Ra in a range of 0.35 to 1.00 μm.

18. The method for manufacturing a printed wiring board according to claim 13, wherein the plurality of plating bumps is formed such that the base plating layer has a thickness measured from a surface of the solder resist layer in a range of 3 μm to 20 μm.

19. The method for manufacturing a printed wiring board according to claim 13, wherein the plurality of plating bumps is formed such that the top plating layer has a thickness measured from a lower end of the top plating layer to a top of the top plating layer in a range of 5 μm to 45 μm.

20. The method for manufacturing a printed wiring board according to claim 13, wherein the plurality of plating bumps is formed such that the base plating layer includes a main component comprising copper, that the intermediate layer includes a main component comprising nickel, and that the top plating layer includes a main component comprising tin.

* * * * *